United States Patent [19]
Ceraso

[11] Patent Number: 5,804,013
[45] Date of Patent: Sep. 8, 1998

[54] PROCESS FOR MANUFACTURE BY ENDOTHERMIC HEATING OF PLASTIC LAMINATES IN A CONTINUOUS BAND PRESSED IN CYCLES

[75] Inventor: Bruno Ceraso, Milan, Italy

[73] Assignee: Cedal S.R.L., Milan, Italy

[21] Appl. No.: 553,681

[22] PCT Filed: Oct. 9, 1993

[86] PCT No.: PCT/IT93/00104

§ 371 Date: Nov. 30, 1995

§ 102(e) Date: Nov. 30, 1995

[87] PCT Pub. No.: WO94/29093

PCT Pub. Date: Dec. 22, 1994

[30] Foreign Application Priority Data

Jun. 15, 1993 [IT] Italy .............................. MI93A01275

[51] Int. Cl.[6] .................................................. B32B 31/00
[52] U.S. Cl. .................. 156/202; 156/228; 156/272.2; 156/273.7; 156/324; 156/379.8
[58] Field of Search ................................... 156/580, 581, 156/583.1, 583.4, 196, 199, 200, 201, 202, 228, 272.2, 273.7, 324, 379.6, 379.7, 379.8

[56] References Cited

U.S. PATENT DOCUMENTS

| | | | |
|---|---|---|---|
| 4,062,718 | 12/1977 | Hay, II | 156/498 |
| 4,220,847 | 9/1980 | Focke et al. | 219/388 |
| 4,963,208 | 10/1990 | Muncy et al. | 156/145 |

FOREIGN PATENT DOCUMENTS

| | | |
|---|---|---|
| 2254423 | 7/1975 | France . |
| 2623982 | 6/1989 | France . |
| 397501 | 6/1924 | Germany . |
| 485717 | 5/1938 | United Kingdom . |
| 1321305 | 6/1973 | United Kingdom . |
| 2119710 | 11/1983 | United Kingdom . |

*Primary Examiner*—James Sells
*Attorney, Agent, or Firm*—Michael J. Striker

[57] ABSTRACT

Continuous process for manufacturing, in a cold press (11), plastic laminates with copper laminae and intermediate layers of prepreg, by multicomposition bands (78, 98,118) with copper laminae (62, 63, 82, 83, 103, 103) and bands (73–75, 93–95, 113–115) of prepreg continuously fed in from reels (60, 61, 70–72) which, placed one upon another, pass through the press (11),endothermic heating being provided by circulating electric current in the fractions of copper laminae (62, 63, 82, 83, 102, 103) which remain pressed in the press (11) during cyclic closing stages.

5 Claims, 2 Drawing Sheets

PROCESS FOR MANUFACTURE BY ENDOTHERMIC HEATING OF PLASTIC LAMINATES IN A CONTINUOUS BAND PRESSED IN CYCLES

BACKGROUND OF THE INVENTION

The invention concerns processes for manufacturing plastic laminates with metal laminae, especially for printed circuits.

The term plastic laminates usually means sheets made by stable association, generally by pressing, of several layers of plastic materials on a base of paper, fibreglass fabrics or other types of prepreg, in any case insulating.

In manufacturing printed circuits a metal lamina, normally of copper, is made to adhere to one or both sides when pressing takes place.

In this way a pile of packages, all practically the same, is formed each package comprising a number of impregnated sheets of plastic materials and copper laminae placed on the two sides of the package respectively.

A metal sheet, of stainless steel or some other type, is placed between each package and the pile put in a multiplate press which supplies heat and pressure at the same time.

Presses of this kind are generally complex and of no great efficiency because of the high temperatures and pressure levels needed, of the number of plates they contain, of having to produce heat and pressure in well-defined and accurate sequences, of the need to create—by conduction—uniform temperatures throughout the packages in the pile of which only those packages at top and bottom can be in direct contact with the heating plates.

Propagation of heat by the press plates to the piled-up packages and of refrigeration units is severely hindered by their having to pass through prepreg components,which are well-known to be very poor conductors, in the packages at the top and bottom of each pile.

The number of plates in the press not only complicates its structure but also delays loading and unloading of packages as well as creating problems for short runs on account of having to amortize their higher costs.

The machines and equipment for the manufacture of continuous plastic laminates are well known.

A multi-composition band is prepared including bands of copper and others of prepreg. Machinery comprising a hot press maintain adequate pressure on the multi-composition band and move it forward at the same time at a suitable speed for applying to the material a heat-pressure cycle for a sufficiently long time to transform it into a rigid plastic laminate.

Even with this process machine output is adversely affected by the presence of heating plates and by the difficulty of applying pressure simultaneously to several of such bands.

The process does not therefore usually give the results expected from a continuous system particularly as it is a complex matter to apply heat and pressure to moving parts.

SUMMARY OF THE INVENTION

Subject of the invention is a process for manufacturing plastic laminates with metal laminae, especially copper, and intermediate layers of prepreg, in a cold press with endothermic heating applied by electric current.

The metal laminae and prepreg elements are made from a multi-composition band formed of two metal strips, especially copper, and of intermediate bands of prepreg.

One or more of said multi-composition bands pass, superimposed, through the press cyclicly and continuously unwinding from reels on a feeding device and are pressed down in cycles during closure of the press.

Having completed the pressing cycle, while the press is opening the multicomposition bands, now transformed by the press into plastic laminates, move forward for a length substantially that of the press itself, emerging from it and being replaced by more multicomposition bands, and so on.

In this way continuous lengths of rigid plastic laminates are obtained and can be cut to any particular one desired.

The bands of prepreg are narrower than the laminae and they occupy an axial position in relation so said laminae.

This means that the laminae project from the two sides of the bands of prepreg.

Among the multicomposition bands lying above in the press, intermediate sheets of insulating material are inserted and to each of these, one after another, on a lateral edge parallel to the multicomposition bands and on alternate sides, there is a piece of highly conductive metal shaped in the form of a squared "C".

This piece of metal projects on either side of the insulating sheets at the edges of the laminae.

Therefore, at closure of the press, the C-shaped metal applied to one edge of the first intermediate insulating sheet simultaneously causes, by its projection onto said sheet, a bend to be made at one edge of the second lamina of a first multicomposition band, laid under said sheet, against the first edge of the first lamina of said multicomposition band, and a bend to be made at the first edge of the first of the laminae of a second multicomposition band, placed above said sheet, against the first edge of the second lamina of said second multicomposition band.

At the same time the C-shaped metal, applied to the edge of the second intermediate sheet situated on the opposite side in relation to the multicomposition bands, at the edge of the first sheet to which this metal is applied, causes a bend to be made at the second edge of the second lamina of said second multicomposition band against the second edge of the first lamina of said multicomposition band.

Similar phenomena take place on all the multicomposition bands that pass through the press.

It follows from the foregoing that closure of the press determines continuous electrical connection among all the laminae squeezed inside the press.

This electrical connection is 'in parallel' among the pairs of laminae of each multicomposition band, and 'in series' serpentine-wise between said pairs.

It is preferable for contact strips to be applied to the top and bottom plates of the press that exercise pressure in cycles on the multicomposition bands passing through, said contact strips being placed at the lateral edges of said multicomposition bands and projecting, in relation to the surface of said plates, to substantially the same extent as the C-shaped pieces of metal project from the edges of the intermediate sheets.

Said contact strips are connected respectively to the two poles of the source of electricity.

Therefore, by placing the intermediate sheets adjacent to the press plates so that the lateral edge, to which the C-shaped metal is applied, lies on the side opposite to that on which said contact strips are placed, when the press closes contact is made between the lateral edge of the first lamina of a multicomposition band facing towards the plates and the bend of said edge against the edge of the second lamina.

It follows that when the press closes there is also automatic closure of the electric circuit between the source of electricity and the pair of laminae which, together with the intermediate bands of prepreg, form the plastic laminates while, at the same time, an automatic start is made with endothermic heating and the pressing cycle.

Preferably the C-shaped metal pieces are applied to the edges of the intermediate insulating sheets with intermission between them of pieces of suitably shaped rubber or equivalent means.

Height of the C-shaped metal is greater than that of the spaces between contiguous intermediate sheets after deduction of the thickness of the edges of the laminae forming part of a multicomposition band between said sheets.

Therefore when the press closes the elasticity of said rubber pieces ensures optimum matching between the edges of each pair of laminae of each multicomposition band, and electrical continuity among all the pairs of superimposed multicomposition bands.

The advantages of this invention are evident.

Output is extremely high as this is related to the heating cycle which is very short compared with systems at present in use.

This is because the type of heating used makes it possible to heat the multicomposition bands only, to become plastic laminates, and not the whole press.

In the cold press used it is obvious that numerous multicomposition bands can be put in, one above another, each of which will form a continuous strip of plastic laminate.

Absorption of initial plant costs are low; consumption of energy extremely low.

The manufacturing cycle is complately automatic with all the favourable effects that this implies.

Characteristics and purposes of the invention will be made still clearer by the following example of its execution illustrated by diagrammatically drawn figures.

DESCRIPTION OF PREFERRED EMBODIMENTS

Figure 1:
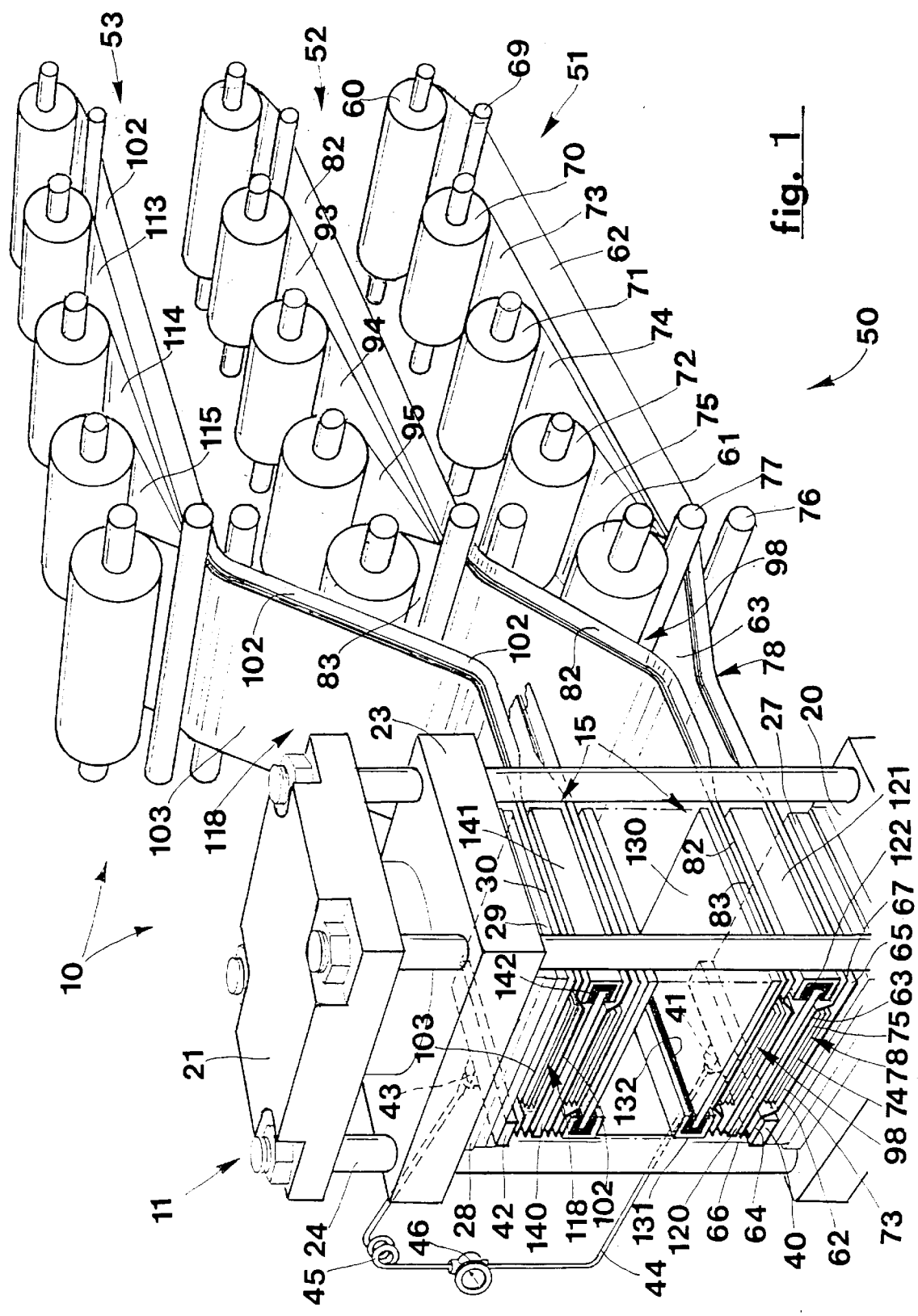
FIG. 1 Press and accessory equipment for manufacturing plastic laminates by the invented process, with the press when closed, perspective view.
Figure 2:
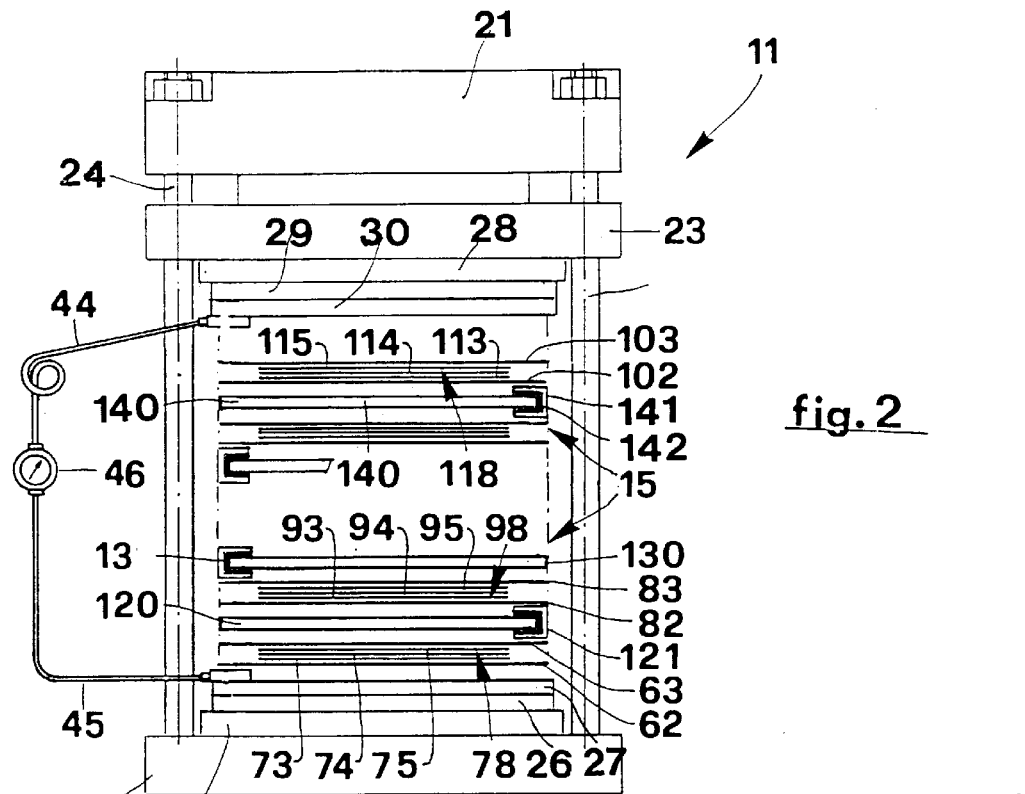
FIG. 2 The press in FIG. 1, when open, front view.

The manufacturing system 10 comprises a cold press 11 and unit 50 for feeding in copper laminae and bands of prepreg. The press 11 comprises the fixed plates at the base 20 and at the top 21 connected by columns 24 and the upper mobile plate 23 moving up and down said columns.

Metal slabs 25 and 26, and the sheet of insulating material 27, are placed on the bottom plate 20.

Metal slabs 28 and 29 and the sheet of insulating material 30 are applied to the mobile plate 23.

An electric contact strip 40 with terminal 41 is fixed to one side of the lower insulating sheet 27.

An electric contact strip 42 with terminal 43 is fixed to one side of the upper insulating sheet 30.

Said terminals 41 and 43 are connected, by cables 44 and 45, to a source 46 of electric current.

The feed unit 50 comprises a series of feeders like 51, 52, 53.

The feeder 51 has two reels 60, 61 respectively for the copper lamina 62 guided by the roller 69 and for the copper lamina 63, and reels 70, 71, 72 of bands 73, 74, 75 of prepreg interposed between the previous two reels.

Said copper laminae and bands of prepreg form a multicomposition band 78 guided by a pair of rollers 76, 77 towards the press 11.

The feeders 52, 53 are composed substantially like feeder 51 and form the multicomposition bands 98 and 118.

The first one comprises the copper laminae 82, 83 and bands of prepreg 93, 94, 95 while the second comprises the copper laminae 102, 103 and prepreg bands 113, 114, 115.

The bands of prepreg are narrower than the copper laminae.

At the beginning of a pressing cycle the end of the multicomposition band 78 is laid on sheet 27 of the press 11.

Over said band the intermediate sheet 120 of insulating material is laid.

A C-shaped piece of copper is applied to the right-hand side of said sheet and in between them a shaped piece of rubber 122.

On said sheet 120 the end of the second multicomposition band 98 is laid and over that the second insulating sheet 130.

Similarly to the above, on the left-hand side of said sheet a C-shaped piece of copper is applied with a piece of shaped rubber 132 in between them.

On the sheet 130 the end of a third multicomposition band is laid and so on till the multicomposition band 118 has been laid to complete the pile 15 of packages of laminates formed by said multicomposition bands.

Figure 3:
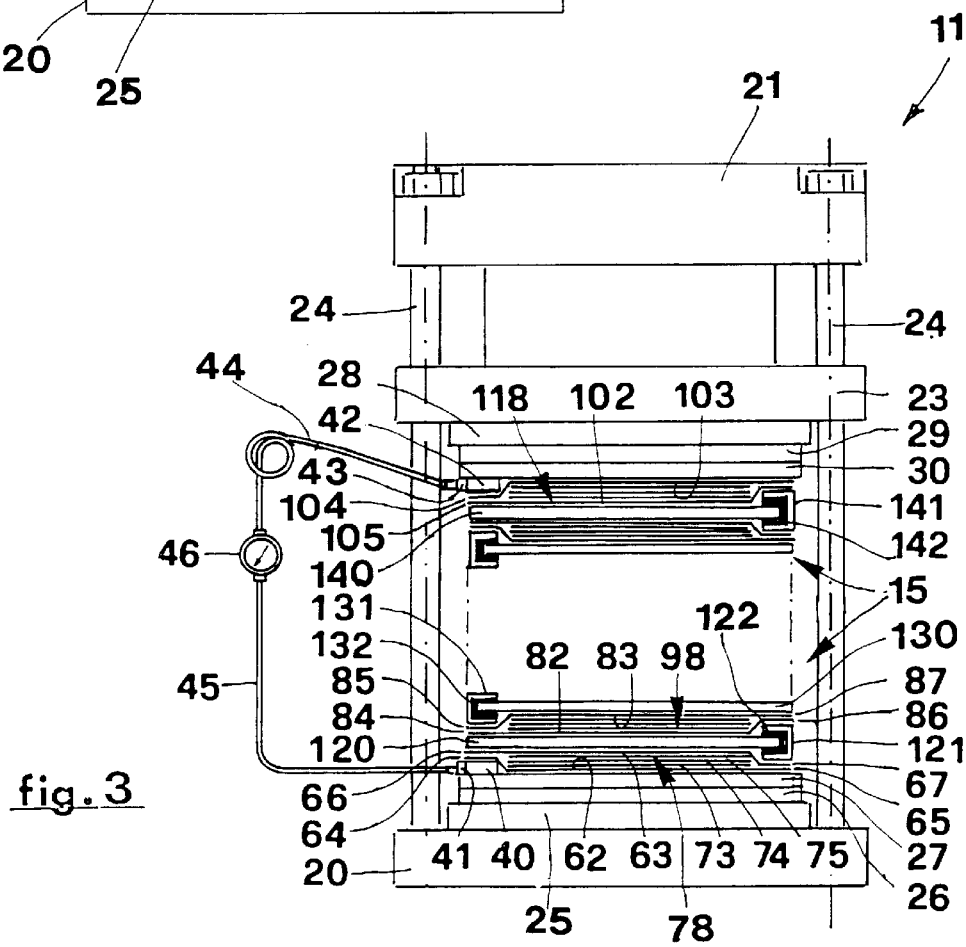
FIG. 3 The press in FIG. 2, when closed, front view.

As the copper laminae are wider than the prepreg bands, the end 64 of the copper lamina 62 and the end 67 of the copper lamina 63 bend as shown in FIGS. 1 and 3 due to the effect of reliefs created by the contact strip 40 and by the C-shaped laterally applied piece of copper 121, coming in contact with the other opposing ends 66 and 65 of said bands.

Similarly the end 85 of the copper lamina 83 and the end 86 of the copper lamina 82 bend due to the effect of reliefs created by the C-shaped piece of copper 121 already indicated and of the similar piece of copper 131 on the sheet 130.

The same applies to the other components of the pile 15.

In view of the above the closure of the press 11 creates reciprocal contact between the contact strip 40 and the ends 64, 66 of the copper laminae 62, 63, between the other ends 65, 67 of said copper laminae and one side of the lateral C-shaped metal 121, between the other side of said piece of C-shaped metal and the ends 86, 87 of the copper laminae 82, 83, between the second ends 84, 85 of said laminae and the C-shaped piece of copper 131 on a second intermediate sheet 130, and so on to completion of the pile 15 by the intermediate sheet 140 with its lateral C-shaped piece of copper 141 and shaped piece of rubber 142.

As explained, each package has two laminae, one above and one below, formed by the ends of the two copper laminae in contact with each other at the sides, and is connected to another, alternately, serpentine-wise, in series, from one side of the pile to the opposite one by means of the lateral C-shaped pieces of copper associated to the intermediate sheets.

When the press closes at the same time the electric circuit is closed between the generator of electricity 41 and all the packages of laminates formed by the multicomposition bands.

When electric current passes through them the laminae act as electric resistances and heat the packages as indicated by the arrows.

Pressing is therefore done accompanied by endothermic heating.

In the figures the various parts which, when the press closes, come in contact and partially bend, are drawn for clarity better separated than in reality so that they may be more easily distinguished.

I claim:

1. A process of manufacturing plastic laminates with metal laminates composed of copper in a cold press with endothermic heating by electricity, the process comprising the steps of obtaining the metal laminae of copper and the band of prepreg from a multiposition band formed by two metal laminae and intermediate bands of prepegs; unwinding one or more of the multicomposition bands in cycles from reels of a feeder; passing the unwound multicomposition bands through a press; pressing the multicomposition bands when the press closes; applying endothermic heating by circulation of electric current in fractions of the metal laminae that remain closed when the press is closed; completing a pressing cycle so that the multiposition bands are transformed inside the press into plastic laminates; opening the press and moving the plastic laminates forward for a length substantially that all the press; moving the plastic laminates outside of the press; and replacing the plastic laminates by other fractions of the multicomposition bands, to form a continuous rigid strip of plastic laminates.

2. A process as defined in claim 1; and further comprising the steps of selecting a width of the prepeg bands less than a width of the plastic laminae, so that the plastic laminae project on each side of the prepeg bands; superimposing the multicomposition bands inside the press with intermediate sheets of insulating material; applying a highly conductive C-shaped piece of metal on the intermediate sheets of insulating material so that the piece projects from both surfaces of the intermediate sheet at a position corresponding to a position of edges of the laminae, so that when the press is closed the C-shaped metal piece applied to an edge of a first intermediate sheet causes a first edge of a second metal laminae of a first multicomposition band to bend against the first edge of the second metal laminae of the multicomposition band, and causes a first edge of the first metal laminae of a second multicomposition band to bend against the first edge of the second metal laminae of the second multicomposition band, while the C-shaped piece of metal applied to an edge of a second intermediate sheet causes bending of a second edge of a second metal laminae of a second multicomposition band against a second edge of a first metal laminae of the second multicomposition band, and so on and so forth so as to cause upon closure of the press a continuous electrical connection among all the fractions of the metal laminae that are pressed together, said connection being in parallel among pairs of the metal laminae in each multicomposition band in series serpentinewise between the pairs.

3. A process as defined in claim 1; and further comprising applying on upper and lower plates of the press to contact bodies of electrically conductive material separated from other parts of the press by insulating means; connecting the contact bodies to two poles of a source of electricity, so that when the press is closed, electric circuit also closes between the source of electricity and pairs of the metal laminae which together with the intermediate bands of prepeg form the plastic laminates, so as to automatically start the endothermic heating and a pressing cycle.

4. A process as defined in claim 1; and further comprising applying two upper and lower plates of the press metal contact strips raised in relation to a surface of the plates to an extent substantially equal to a thickness of the C-shaped piece of metal; and connecting the contact strips by electrical conductors to a source of electricity, so that the C-shaped piece of metal is applied on a lateral edge of the intermediate sheets which is opposite to a lateral edge where the contact strips are located, and where the press closes contact is made between lateral edges of the metal laminae of the multicomposition band placed next to the plates of the press and the contact strips, and the edges of one metal laminae are pressed against the edges of the other metal laminae of the multicomposition band, so that an electrical circuit between the source and the pairs of metal laminae which together with the intermediate bands of prepeg form the plastic laminates is automatically closed, and simultaneously automatic starting of endothermic heating of the endothermic heating and of the pressing cycle is performed.

5. A process as defined in claim 4; and further comprising interposing C-shaped pieces of rubber between the C-shaped pieces of metal and the edges of the intermediate sheets, so that when the press closes the edges of each pair of the metal laminae of each multicomposition band are matched and electrical continuity is established among all the pairs of metal laminae of the multicomposition bands that pass through the press.

* * * * *